United States Patent [19]

Harzer

[11] 4,075,558

[45] Feb. 21, 1978

[54] METHOD OF AND SYSTEM FOR METERING A PERIODICALLY VARYING VOLTAGE

[75] Inventor: Peter Harzer, Eningen, Germany

[73] Assignee: Wandel U. Goltermann, Reutlingen, Germany

[21] Appl. No.: 720,785

[22] Filed: Sept. 7, 1976

[30] Foreign Application Priority Data

Sept. 6, 1975 Germany .......................... 2539694

[51] Int. Cl.² .................... G01R 17/06; G01R 19/22
[52] U.S. Cl. ................................. 324/99 R; 324/111; 324/119
[58] Field of Search ................. 324/119, 99 D, 123 R, 324/132, 99 R, 111, 102, 123 C, 109; 328/26, 144

[56] References Cited

U.S. PATENT DOCUMENTS 3,571,706  3/1971  Bjor .................................. 324/99 D Primary Examiner—James B. Mullins
Assistant Examiner—Ernest F. Karlsen
Attorney, Agent, or Firm—Karl F. Ross

[57] ABSTRACT

The average amplitude of an incoming signal voltage of variable frequency is measured by half-wave rectification of that signal voltage to produce a pulsating current which is subtracted from a continuous current in the input of an integrating amplifier. The fluctuating output voltage of this amplifier is periodically sampled, once per cycle of the signal voltage, to provide a train of corrective pulses. These pulses are accumulated to provide a reference voltage fed to a differential amplifier which controls the continuous current in response to differences between this reference voltage and a feedback voltage proportional to that current to compensate for changes in average signal amplitude. The magnitude of the continuous current, read by a meter, is therefore a measure of the desired amplitude. The voltage samples may be weighted, in proportion to signal frequency, by a variable-gain amplifier or a sampling switch closed for different periods in the output of the integrating amplifier referred to. A second integrating amplifier, in cascade with the first one, may receive the voltage samples and store them on one of two series-connected condensers in its feedback circuit, the other of these condensers being periodically discharged and serving only to accelerate the response of the system to changes in amplitude and/or frequency of the input voltage.

10 Claims, 4 Drawing Figures

METHOD OF AND SYSTEM FOR METERING A PERIODICALLY VARYING VOLTAGE

FIELD OF THE INVENTION

My present invention relates to a method of and a system for determining the average amplitude of a periodically varying input voltage whose frequency is subject to change.

BACKGROUND OF THE INVENTION

In telecommunication systems in which variable-frequency test signals are used to check transmission lines and other circuit elements, the amplitude of the incoming signal voltage can be measured with the aid of a variety of rectifiers whose output may be proportional to the RMS, medium or peak value of the signal voltage. All these rectifiers include smoothing circuits designed to integrate the voltage amplitudes over a succession of cycles. If the frequency swing is wide, the smoothing circuits will have to have time constants which are too large to let the output current of the rectifier follow rapid amplitude changes at the upper end of the frequency range. Thus, in conventional measuring systems in which the test frequency is periodically modulated or wobbled in a band whose lower limit is around 10 Hz, distortions are difficult to avoid at the higher audio frequencies.

OBJECT OF THE INVENTION

The object of my present invention, therefore, is to provide a method and a system enabling a more precise measuring of such average signal amplitudes over a wide frequency range.

SUMMARY OF THE INVENTION

In accordance with my present invention, the alternating input signal to be measured is subjected to half-wave rectification whereby alternate half-cycles are suppressed and a unipolar pulsating current is produced (unless, of course, the input signal is already a unipolar pulse train). This pulsating current is subtractively combined with a continuous current of variable magnitude, the resulting current difference being integrated to produce an output voltage returning to substantially the same level at a certain point in each cycle of the input signal. This output voltage is sampled, at that point, with or without integration, and in an unbalanced state delivers corrective pulses that are accumulated to provide a reference voltage whose comparison with a feedback voltage proportional to the continuous current yields a control variable for modifying the magnitude of the latter current so as to compensate for changes in signal voltage. The magnitude of this continuous current, therefore, will be a measure of the average signal amplitude and can be read on a meter in the supply circuit.

According to another feature of my invention, designed to accelerate the response of the system to amplitude changes at high signal frequencies, the voltage samples from the integrator are weighted by a factor varying with the frequency or pulse cadence of the input voltage. This can be accomplished with the aid of a variable-gain amplifier in the integrator output whose gain is controlled by a sawtooth generator triggered by the input voltage, the amplifier multiplying the output voltage of the integrator by a factor proportional to the signal frequency. Another possibility in the case of two cascaded integrators is to vary, in response to that signal frequency, the closure time of a sampling switch in the output of the first integrator by means of a variable-width pulse generator such as an adjustable monoflop.

A further feature of my invention, which may be used with or without a weighting circuit of the type just described, resides in the generation of a supplemental voltage of limited duration — preferably lasting for one signal cycle 13 which is superimposed upon the reference voltage in response to a change in signal amplitude. Such a supplemental voltage can be generated in an integrating amplifier, forming part of the storage circuit for the corrective pulses, provided with a pair of series-connected feedback condensers one of which is periodically short-circuited so as to charge only when the value of the fluctuating output voltage at the instant of sampling differs from the reference voltage stored in the other feedback condenser.

BRIEF DESCRIPTION OF THE DRAWING

The above and other features of my invention will now be described in detail with reference to the accompanying drawing in which.

SPECIFIC DESCRIPTION

Figure 1:
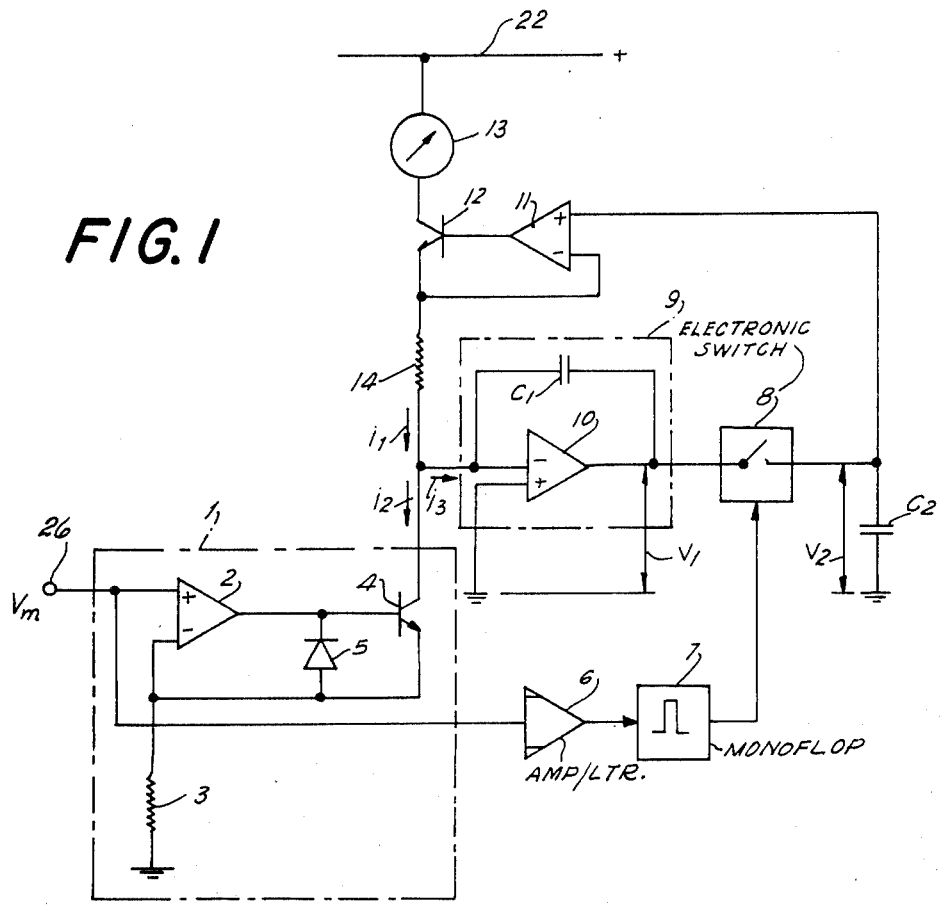
FIG. 1 is a block diagram showing an amplitude-measuring system according to my invention.

In FIG. 1 I have shown an input terminal 26 carrying an incoming alternating signal voltage $V_m$ whose amplitude is to be measured. Terminal 26 is connected to a noninverting input (+) of a differential amplifier 2 forming part of a half-wave rectifier 1, the inverting input (−) of this amplifier being grounded through a resistor 3. Rectifier 1 further comprises an NPN transistor 4 whose base is connected to the amplifier output and whose emitter is also connected to resistor 3; the base/emitter circuit of this transistor is shunted by a diode 5 whose polarity is in antiparallel relationship therewith. The collector of transistor 4 is connected to a supply 22 of direct current via another NPN transistor 12 in series with a milliammeter 13 and a resistor 14.

An integrator 9 comprises an operational amplifier 10 with a capacitor $C_1$ in its feedback path, this amplifier developing an output voltage $V_1$. The integrator has a small time constant so that voltage $V_1$ will fluctuate within a cycle of input signal $V_m$ in serrate fashion, generally as shown in graph (b) of FIG. 4 and discussed hereinafter. This voltage $V_1$ is periodically sampled, at a cadence corresponding to the frequency of the input signal, during a small fraction of each signal cycle to give rise to a corrective pulse whenever the system is in a state of unbalance. These voltage samples are accumulated in a storage circuit comprising an electronic switch 8 and a capacitor $C_2$, switch 8 being briefly closed under the control of a monoflop 7 which is triggered by the rising flank of a square wave derived from the input signal $V_m$ through an amplifier/limiter 6. The corrective pulses thus obtained charge the capacitor $C_2$ to a reference voltage $V_2$ which is fed to a noninverting input (+) of a differential amplifier 11 whose inverting input (−) receives a feedback voltage from the emitter of transistor 12. The latter transistor, whose base is energized by the output of voltage comparator 11, controls the magnitude of a continuous current $i_1$ flowing from supply 22 into the amplifier 10 whose input impedance should be low compared to resistor 3.

With rectifying transistor 4 conducting during positive half-cycles of input voltage $V_m$, a pulsating current $i_2$ is drawn from the input of amplifier 10 to create a voltage drop across resistor 3 which nearly equalizes the two input voltages of comparator 2. On the following negative half-cycle, diode 5 conducts and transistor 4 is cut off. Amplifier 10, therefore, receives on its inverting input a current $i_3 = i_1 - i_2$ which translates into the fluctuating output voltage $V_1$. In steady-state operation, i.e. as long as the amplitude of input signal $V_m$ does not change, the voltage samples delivered by switch 8 to capacitor $C_2$ have the same aplitude and reference voltage $V_2$ remains constant. If a change occurs, the resulting variation in voltage $V_2$ causes the comparator 11 to modify the conductivity of control transistor 12 in a manner increasing or decreasing the magnitude of continuous current $i_1$ to compensate for the variation in signal amplitude. The reading of the suitably calibrated meter 13, accordingly, represents the instantaneous amplitude of signal $V_m$. Switch 8 and capacitor $C_2$ constitute a sample-and-hold circuit.

Figure 2:
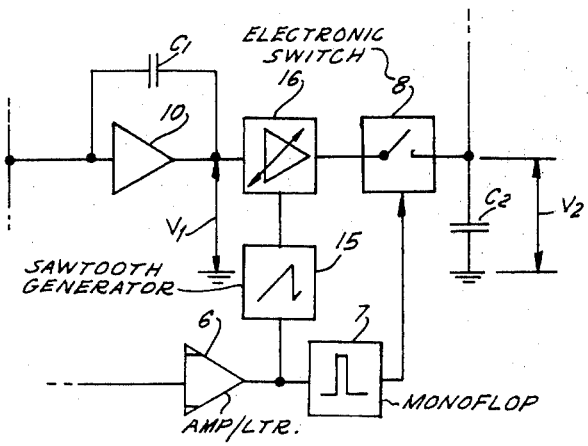
FIG. 2 shows a partial modification of the circuitry of FIG. 1.

FIG. 2 shows a modification of the system of FIG. 1 in which a variable-gain amplifier 16 has been inserted between integrating amplifier 10 and sampling switch 8. A sawtooth-voltage generator 15 has a triggering input connected in parallel, together with monoflop 7, to the output of squarer 6 so as to start a ramp voltage at the beginning of each signal cycle. With increasing signal frequency, the peak of the ramp voltage decreases and leads to an increase in the gain of amplifier 16 with a resulting rise in reference voltage $V_2$. Thus, a given proportional change in signal amplitude at higher frequencies causes a larger voltage difference in the input circuit of comparator 11 and a corresponding intensification of the response of control transistor 12.

Figure 3:
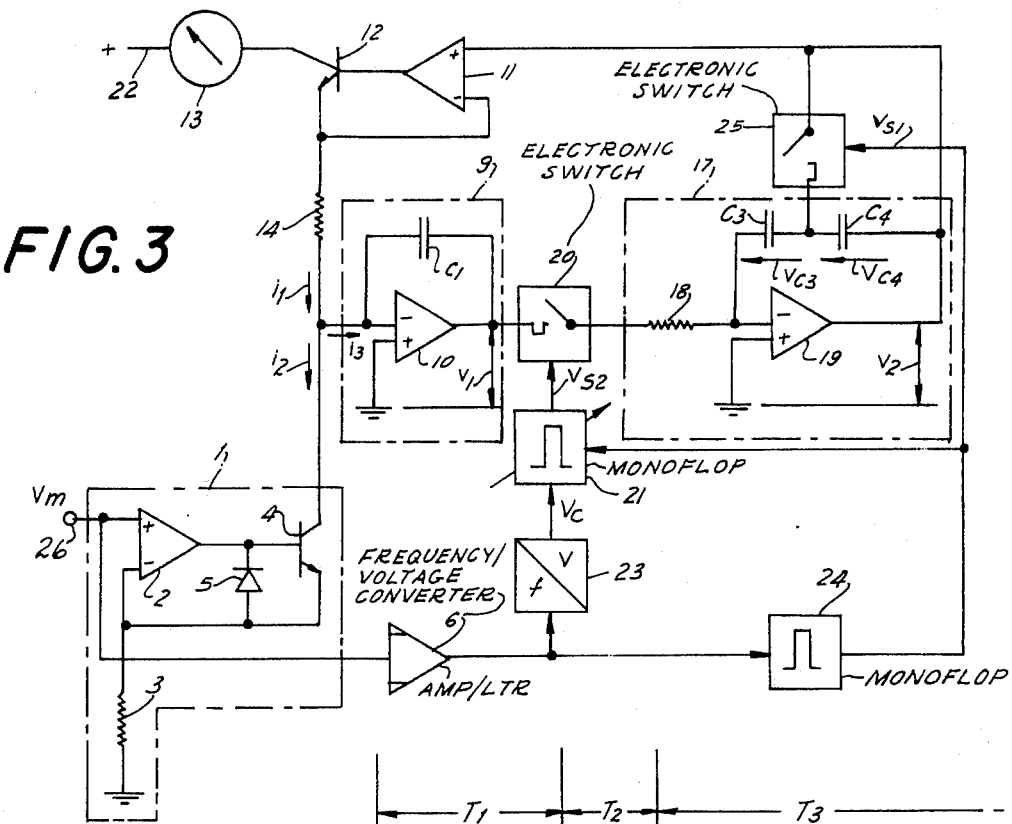
FIG. 3 is a diagram similar to FIG. 1, illustrating another embodiment.

The embodiment of FIG. 3 differs from that of FIG. 1 mainly by the substitution of another integrating network 17 for the storage capacitor $C_2$. Network 17 includes a resistor 18 connected to the inverting input of an operational amplifier 19 having a feedback path with two series condensers $C_3$ and $C_4$, preferably of identical capacitance. The sampling switch 8 of FIG. 1 has been replaced by two electronic switches 20 and 25 closable by output voltages $V_{S1}$ and $V_{S2}$ of respective monoflops 21 and 24 connected in cascade, monoflop 21 having an off-period whose duration is variable by a voltage $V_c$ applied to a control electrode of this multivibrator from a frequency/voltage converter 23 which is fed in parallel with monoflop 24 from the output of squarer 6. Thus, switch 20 is closed for a period which increases proportionally with signal frequency (though always remaining, of course, substantially less than a signal cycle) in order to augment the charging current flowing into condensers $C_3$ and $C_4$ through resistor 18. Switch 25 is closed for a fixed period immediately before closure of switch 20, monoflop 21 responding to the descending flank of voltage pulse $V_{S1}$. Condenser $C_4$, short-circuited by switch 25, is thus discharged at the beginning of each new cycle.

In steady-state operation, in which no corrective pulses are fed to amplifier 19 upon closure of switch 20, the voltage $V_{C3}$ stored on condenser $C_3$ remains constant, condenser $C_4$ does not charge and no significant change occurs in reference voltage $V_2$. The appearance of such a pulse, however, causes a reduction in the input voltage of amplifier 19 which results in an increase of its output voltage, or vice versa, so that the feedback capacitances $C_3$, $C_4$ are subjected to a voltage difference equaling twice the increment of the sampled voltage $V_1$. This results in a positive or negative charging of condenser $C_4$ whose voltage $V_{C4}$ is now superimposed upon the voltage $V_{C3}$ of condenser $C_3$ whereby a steeper change occurs in the reference voltage applied to the positive input of comparator 11.

Figure 4:
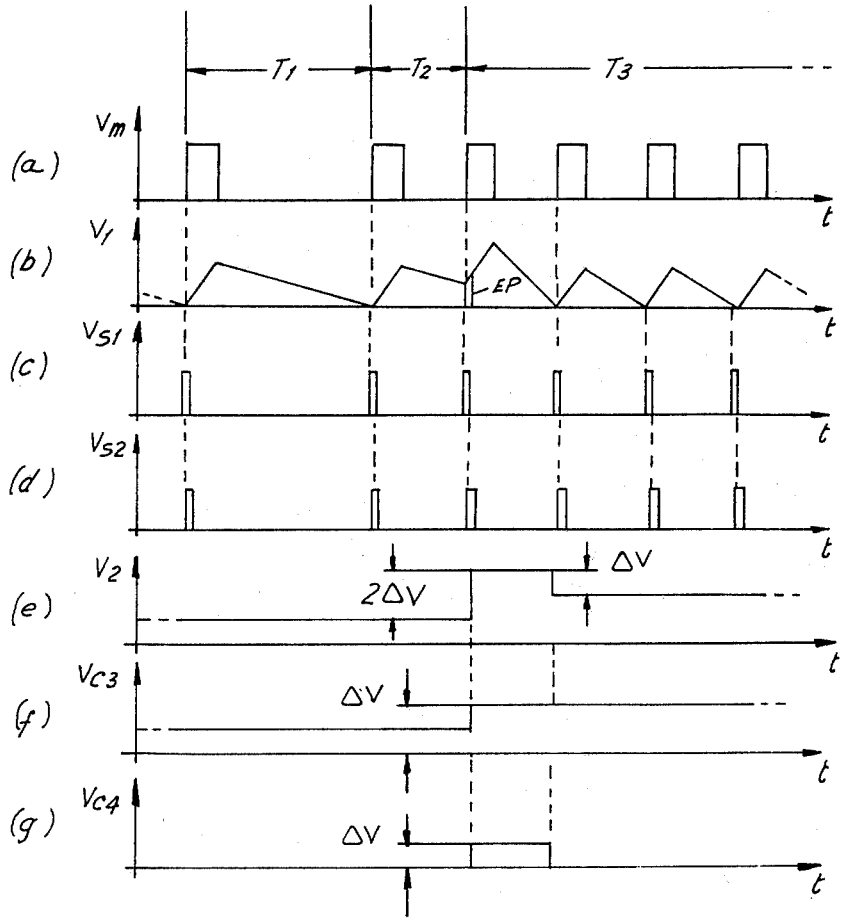
FIG. 4 is a set of graphs relating to the operation of the system of FIG. 3.

In FIG. 4, graph (a) shows a signal voltage $V_m$ here represented by a sequence of rectangular pulses of positive polarity. Voltage $V_1$, graph (b), rises in the presence of a pulse and falls to zero, in a state of equilibrium, during the remainder of the cycle, yielding no correction during a steady-state interval $T_1$ in which the signal frequency is low. Switching pulses $V_{S2}$ produced by monoflop 21, illustrated in graph (d), follow discharge pulses $V_{S1}$ from monoflop 24 as shown in graph (c). Reference voltage $V_2$, graph (e), is at a low level during time $T_1$, as is condenser voltage $V_{C3}$ shown in graph (f). Condenser voltage $V_{C4}$, graph (g), is zero at this time as explained above.

During a transition period $T_2$ the signal frequency rises and prevents voltage $V_1$ from returning to its previous bottom level. Thus, there occurs a corrective pulse EP of a value $\Delta V$ applying a charge voltage equal to $2\Delta V$ across condensers $C_3$ and $C_4$. This temporarily raises the reference voltage $V_2$ by the same double increment as condenser $C_4$ charges to voltage $\Delta V$ during the next cycle. Thereafter the signal frequency is assumed to remain constant, at its higher value, for another steady-state period $T_3$ so that condenser $C_4$ does no recharge after that one cycle; reference voltage $V_2$ continues at a level which exceeds its previous level by $\Delta V$.

Although squarer 6 has been shown connected to input terminal 26, it will be apparent that it could also be energized from the output of rectifier 1 (e.g. from the emitter of transistor 4).

From the foregoing description, and especially from graph (b) of FIG. 4, it will be noted that in steady-state operation (periods $T_1$ and $T_3$) the reverse-charging of capacitor $C_1$ by the flow of current $i_2$ during conduction of transistor 4 is virtually compensated by the magnitude of the continuously flowing current $i_1$ traversing transistor 12 so that the capacitor charge, and therefore the voltage $V_1$, returns to substantially the same level at the end of each cycle of input voltage $V_m$. The weighting of any deviation from that level by the frequency-dependent circuitry 15, 16 or 21, 23 intensifies the resulting change in reference voltage $V_2$ to accelerate the re-establishment of this steady-state condition during a transition period ($T_2$), a further acceleration occurring in the system of FIG. 3 as a result of the voltage amplification introduced by capacitor $C_4$ in the feedback path of integrating amplifier 17 in the first cycle of the new pulse cadence in which the frequency-sensitive weighting circuitry is not yet effective. The last-mentioned acceleration, of course, will take effect also if the corrective pulse EP is due to a change in pulse amplitude or width, rather than in pulse cadence.

I claim:

1. A method of determining the average amplitude of a pulsating input voltage, comprising the steps of:
   charging a capacitor with a continuous current;

reverse-charging said capacitor during pulsations of said input voltage and at a rate depending upon the magnitude of said pulsations;

sampling the charge of said capacitor at a point in each cycle of said input voltage, substantially coinciding with the beginning of a pulsation, at which said charge is at a substantially constant level during steady-state operation;

deriving from successive charge samples a reference voltage controlling the magnitude of said continuous current to compensate for variations of said level due to changes in said voltage; and measuring the magnitude of said continuous current.

2. A method as defined in claim 1, comprising the further step of weighting variations of said level by a factor depending on the pulse cadence of said input voltage for accelerating the compensation of said variations.

3. A system for determining the average amplitude of a pulsating input voltage, comprising:

a supply of continuous direct current;

a capacitor connected to said supply for charging by said continuous current;

subtractive circuitry including first current-control means pulsed by said input voltage connected to said capacitor for reverse-charging same during pulsations of said input voltage at a rate depending upon the magnitude of said pulsations;

switch means controlled by said input voltage and connected to said capacitor for sampling the charge thereof at a point in each cycle of said input voltage, substantially coinciding with the beginning of each pulsation, at which said charge is at a substantially constant level during steady-state operation;

storage means connected to said switch means for deriving a reference voltage from successive charge samples;

second current-control means in series with said supply;

circuit means connecting said storage means to said second current-control means for varying the magnitude of said continuous current in response to said reference voltage to compensate for variations of said level due to changes in said input voltage; and metering means in series with said second current-control means for measuring the magnitude of said continuous current.

4. A system as defined in claim 3 wherein said capacitor is part of a feedback circuit of an integrating operational amplifier having an inverting input connected to a junction of said first and second current-control means and having an output connected to said switch means.

5. A system as defined in claim 4, further comprising weighting means pulsed by said input voltage in the output of said operational amplifier for multiplying the variations of said level by a factor dependent upon the pulse cadence of said input voltage to accelerate the compensation of said variations.

6. A method as defined in claim 1, comprising the further step of generating a supplemental voltage in response to a charge sample differing from an immediately preceding one, maintaining said supplemental voltage for one cycle of said input voltage, and superimposing said supplemental voltage upon said reference voltage for accelerating the compensation of said variations.

7. A system as defined in claim 5 wherein said weighting means comprises a variable-gain amplifier in series with said switch means and a sawtooth-voltage generator triggerable by said input voltage connected to a gain-control electrode of said variable-gain amplifier for changing the amplitude of said charge samples in proportion to said pulse cadence.

8. A system as defined in claim 5 wherein said weighting means comprises a timing circuit for said switch means including a variable-width pulse generator and frequency-responsive means energizable by said input voltage for changing the closure time of said switch means in proportion to said pulse cadence, said storage means including integrating circuitry.

9. A system as defined in claim 4 wherein said storage means includes a further integrating amplifier with a pair of series-connected feedback condensers and short-circuiting means controlled by said input voltage for periodically discharging one of said feedback condensers to superimpose upon said reference voltage a supplemental voltage of limited duration in response to the occurrence of a charge sample differing from an immediately preceding one, thereby accelerating the compensation of said variations.

10. A system as defined in claim 9 wherein said feedback condensers are of substantially equal capacitance.

* * * * *